United States Patent [19]
Goto et al.

[11] Patent Number: 4,908,624
[45] Date of Patent: Mar. 13, 1990

[54] SUCCESSIVE APPROXIMATION TYPE A/D CONVERTER

[75] Inventors: Junkei Goto, Kawasaki; Tetsuya Iida, Yokohama, both of Japan

[73] Assignee: Kabushiki Kaisha Toshiba, Kawasaki, Japan

[21] Appl. No.: 216,046

[22] Filed: Jul. 7, 1988

[30] Foreign Application Priority Data

Jul. 8, 1987 [JP] Japan .................. 62-170199

[51] Int. Cl.⁴ .......................................... H03M 1/12
[52] U.S. Cl. ................................. 341/172; 341/165; 341/155; 307/355
[58] Field of Search ............ 341/165, 155, 172; 307/355, 356

[56] References Cited

U.S. PATENT DOCUMENTS

| | | | |
|---|---|---|---|
| 4,293,848 | 10/1981 | Cheng et al. | 341/165 |
| 4,476,456 | 10/1984 | Domogalla | 341/172 |
| 4,656,429 | 4/1987 | Masuda et al. | 307/355 |
| 4,760,287 | 7/1988 | Goto et al. | |
| 4,764,753 | 8/1988 | Yukawa | 341/172 |
| 4,791,405 | 12/1988 | Rybicki et al. | 341/172 |
| 4,831,381 | 5/1989 | Hester | 341/172 |

OTHER PUBLICATIONS

Andrew G. F. Dingwall (RCA Laboatories), "Monolithic Expandable 6 Bit 20 MHz CMOS/SOS A/D Converter", IEEE J. of S.S.C., vol. SC-14, No. 6, pp. 926-932, published Dec. 1979.

Primary Examiner—William M. Shoop, Jr.
Assistant Examiner—Helen Kim
Attorney, Agent, or Firm—Finnegan, Henderson, Farabow, Garrett and Dunner

[57] ABSTRACT

A successive approximation type A/D converter of the present invention has a capacitor having a predetermined capacitance value and arranged between an input terminal of a voltage comparator and a fixed potential terminal having a predetermined potential. According to the successive approximation type A/D converter of the present invention, the capacitor arranged between the input terminal of the voltage comparator and the fixed potential terminal having the predetermined potential prevents a potential at the input node of the voltage comparator from being greatly changed to exceed a power source voltage range due the influences of a local D/A converter when the sample mode is switched to the approximation mode. Therefore, the leakage of charges stored in the input side of the voltage comparator can be prevented. Accordingly, even if the amplitude of an analog input voltage is equal to the amplitude of the power source voltage, high-precision A/D conversion can still be performed.

6 Claims, 3 Drawing Sheets

SUCCESSIVE APPROXIMATION TYPE A/D CONVERTER

BACKGROUND OF THE INVENTION

1. Field of the Invention

The present invention relates to an A/D converter (analog-to-digital converter) used in various electronic devices and, more particularly, to a successive approximation type A/D converter formed into an integrated circuit.

2. Description of the Related Art

Generally, a successive approximation type A/D converter samples an analog voltage input, supplies a successive approximation control digital output from a successive approximation type control circuit to a local D/A converter to cause the D/A converter to generate a local analog voltage, compares the sampled and held analog voltage with the local analog voltage, and successively determines the value of each bit of an A/D conversion output on the basis of the relationship in magnitude between the compared voltages, thereby obtaining an A/D conversion output having a plurality of bits from the successive approximation type control circuit.

FIG. 1 shows a 3-bit A/D converter as a successive approximation type A/D converter. More specifically, reference symbols C1 and C2 respectively denote capacitors each having capacitance value C; C3, a capacitor having capacitance value 2C; C4, a capacitor having capacitance value 4C; A, an inverting amplifier; and SW, a switch. They constitute a voltage comparator. Reference numeral 1 denotes an analog input terminal; 2, a reference voltage terminal; and 3, a ground terminal. Reference symbols SL1 to SL4 denote selectors whose selective connection states are controlled by successive approximation control digital signals; and B, a successive approximation type control circuit having functions of successively outputting the successive approximation control digital signals, and determining each bit value of an A/D conversion output on the basis of the logical level of an output from inverting amplifier A.

The A/D-converting operation of the successive approximation type A/D converter will be described below. In a sample mode, switch SW is set in an ON state, and selectors SL1 to SL4 are controlled in a state for selecting analog input terminal 1. In this case, the potential at input terminal node N of inverting amplifier A becomes threshold voltage Vop. Assuming that an analog input voltage is represented by Vain, then charge Q8 stored in capacitors C1 to C4 can be given as:

$$Q8 = (Vop - Vain) \cdot 8C \quad (1)$$

Subsequently, the mode is switched to an approximation mode, wherein switch SW is set in an OFF state, selectors SL1 to SL3 are controlled in a state for selecting ground terminal 3, and selector SL4 is controlled in a state for selecting reference voltage terminal 2. In this case, assuming that the potential at node N is represented by V1, then charge Q1 stored in capacitors C1 to C3, and charge Q2 stored in capacitor C4 are respectively given as:

$$Q1 = (C + C + 2C)V1 \quad (2)$$

$$Q2 = 4C(V1 - V_R) \quad (3)$$

Then, from the principle of conservation of charges, the following equation can be established at node N:

$$Q8 = Q1 + Q2 \quad (4)$$

Therefore, substitutions of equations (1), (2), and (3) into equation (4) yield:

$$(Vop - Vain) \cdot 8C = 4CV1 + 4C(V1 - V_R) \quad (5)$$
$$= 8CV1 - 4CV_R$$
$$Vop - Vain = V1 - \tfrac{1}{2}V_R$$
$$V1 - Vop = \tfrac{1}{2}V_R - Vain$$

In equation (5), since V1>Vop when $\tfrac{1}{2}V_R$>Vain, the output from inverting amplifier A goes to low level. Since V1<Vop when $\tfrac{1}{2}V_R$<Vain, the output from inverting amplifier A goes to high level. Successive approximation type control circuit B determines the value ("1" or "0") of an MSB (most significant bit) of a digital output to be output from successive approximation type control circuit B on the basis of the output from inverting amplifier A, and supplies a control signal to selectors SL2 to SL4 to perform an approximation operation corresponding to the next significant bit. The operation that successive approximation type control circuit B outputs a certain successive approximation control signal, and then determines the value of a certain bit on the basis of an output from the inverting amplifier is repeated a predetermined number of times (three times in the embodiment), thereby determining a 3-bit A/D conversion output.

In order to perform A/D conversion with high precision in the successive approximation type A/D converter described above, the charges stored in capacitors C1 to C4 in the approximation mode must be held. In this case, if a MOS transistor is used for the input stage of inverting amplifier A and an input signal is supplied to its gate, no problem is posed because of a very high input impedance. However, in inverting amplifier A whose input terminal is connected to node N, the problem of charge leakage caused by switch SW connected to node N is posed. A case will be taken into consideration, wherein as the switch SW, a CMOS analog switch comprising parallel-connected n- and p-channel transistors TN1 and TP1 having gates for respectively receiving complementary switch control signals $\phi$, and $\bar{\phi}$ is used, as shown in, e.g., FIG. 2A. FIG. 2B shows an equivalent circuit of this analog switch. Referring to FIG. 2B, reference symbols $D_p$ and $C_p$ denote diodes and capacitors, respectively both of which have junctions with the source and drain of p-channel transistor TP1; and $D_N$ and $C_N$, diodes and capacitors, respectively both of which have junctions with the drain and source of n-channel transistor TN1. In the case wherein the above-described A/D converter is operated at $V_{DD}$ voltage=5 V and analog input voltage Vain=0 to 5 V, if selector SL4 is set in a state for selecting reference voltage terminal 2 before selectors SL1 to SL3 are set in a state for selecting ground terminal 3 when the sample mode is switched to the approximation mode, potential V1 at node N becomes $Vop + V_R - Vain$. In this case, normally, if sampling is performed at VOP=2.5V, $V_R$=5V, and Vain =0V, then V1=7.5V. Diodes $D_p$ in FIG. 2B are rendered conductive, and the charges stored in capacitors C1 to C4 leak. For this reason, a proper A/D conversion output cannot be obtained. In contrast to this, if selectors SL1 to SL3 are set in a state for selecting ground terminal 3 before selector SL4 is set in a state for selecting reference voltage terminal 2 when the sample mode is switched to the approximation mode, potential V1 at node N becomes Vop−Vain. Thus, if sampling is performed at Vain=5, then V1 =−2.5V. As a result, diodes $D_N$ are rendered conductive, and the charges at node N leak. Similarly, a proper A/D conversion output cannot be obtained.

That is, in the conventional successive approximation type A/D converters described above, if analog input voltage Vain appears near $V_{DD}$ voltage or the ground potential, potential V1 at input terminal node N of inverting amplifier A for comparing voltages may be greatly changed to be higher than $V_{DD}$ power source voltage or to be lower than the ground potential because of the influences of a switching operation of the capacitor array (in other words, a D/A-converting operation for generating a local analog signal) when the sample mode is switched to the approximation mode. In this case, charge leakage occurs in switch SW, and hence a proper A/D-converting operation cannot be performed. For this reason, when the amplitude of analog input voltage Vain is equal to the power source voltage amplitude of the A/D converter, high-precision A/D conversion cannot be performed.

SUMMARY OF THE INVENTION

The present invention has been made to fundamentally solve the problems associated with a great change in potential at the input terminal node of the voltage comparing amplifier caused by the influences of a D/A-converting operation for generating a local analog signal when the sample mode is switched to the approximation mode, as described above. It is an object of the present invention to provide a successive approximation type A/D converter, which can prevent a great change in potential at the input terminal node when the sample mode is switched to the approximation mode, can prevent charge leakage of this node, and can properly perform high-precision A/D conversion even if the amplitude of an analog input voltage is equal to the power source voltage amplitude.

A successive approximation type A/D converter according to the present invention comprises a capacitor having a predetermined capacitance value between the input terminal of a voltage comparator and a fixed potential terminal having a predetermined potential.

According to the successive approximation type A/D converter of the present invention, with the capacitor arranged between the input terminal of the voltage comparator and the fixed voltage terminal with the predetermined voltage, the potential at the input node of the voltage comparator can be prevented from being greatly changed to exceed a power source voltage range because of the influences of the operation of the local D/A converter when the sample mode is switched to the approximation mode, thereby preventing leakage of the charges stored in the input side of the voltage comparator. Therefore, high-precision A/D conversion can be properly performed even when the amplitude of an analog input voltage is equal to the power source voltage amplitude.

DETAILED DESCRIPTION OF THE PREFERRED EMBODIMENTS

Embodiments of the present invention will now be described below with reference to the accompanying drawings.

Figure 3:
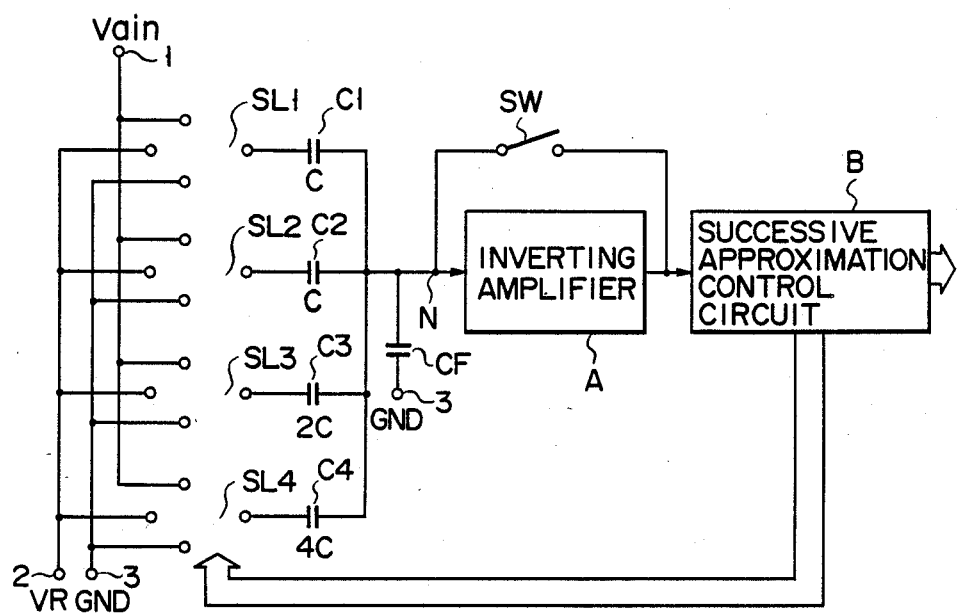
FIG. 3 is a circuit diagram of a successive approximation type A/D converter according to an embodiment of the present invention.

FIG. 3 shows a 3-bit successive approximation type A/D converter formed into an MOS (insulated-gate type) integrated circuit. Referring to FIG. 3, reference symbols C1 and C2 denote capacitors each having predetermined capacitance value C; C3, a capacitor having capacitance value 2C; and C4, a capacitor having capacitance value 4C. The other terminal of each of capacitors C1 to C4 is commonly connected, and is also connected to the input terminal (node N) of inverting amplifier A. Switch SW is connected between the input and output terminals of inverting amplifier A. Inverting amplifier A and switch SW constitute a voltage comparator. Reference symbols SL1 to SL4 denote selectors for selectively connecting to analog input terminal 1, reference voltage 2 or ground terminal 3, one terminal of each of capacitors C1 to C4. The selectors are controlled by successive approximation control digital signal outputs from successive approximation type control circuit B, which will be described later. Capacitors C1 to C4 and selectors SL1 to SL4 constitute a circuit for sampling analog voltage input Vain supplied to analog input terminal 1 and storing the resultant value, and a local D/A converter of a capacitor array charge redistribution type for performing D/A (digital-to-analog) conversion using successive approximation control digital signal outputs. Successive approximation type control circuit B described above has functions of successively determining the value of each bit of an A/D conversion output on the basis of an output from inverting amplifier A described above, and of outputting successive approximation control signals for successively generating local analog voltages required for successive approximation.

In addition, according to the embodiment, capacitor $C_F$ having predetermined capacitance value $C_F$(e.g., set to be 4C, which is ½ capacitance value $$\sum_{i=1}^{4}$$

Ci=8C of the capacitor array) is additionally connected between input node N of inverting amplifier A and a fixed potential terminal having a predetermined potential, e.g., ground terminal 3.

Figure 1:
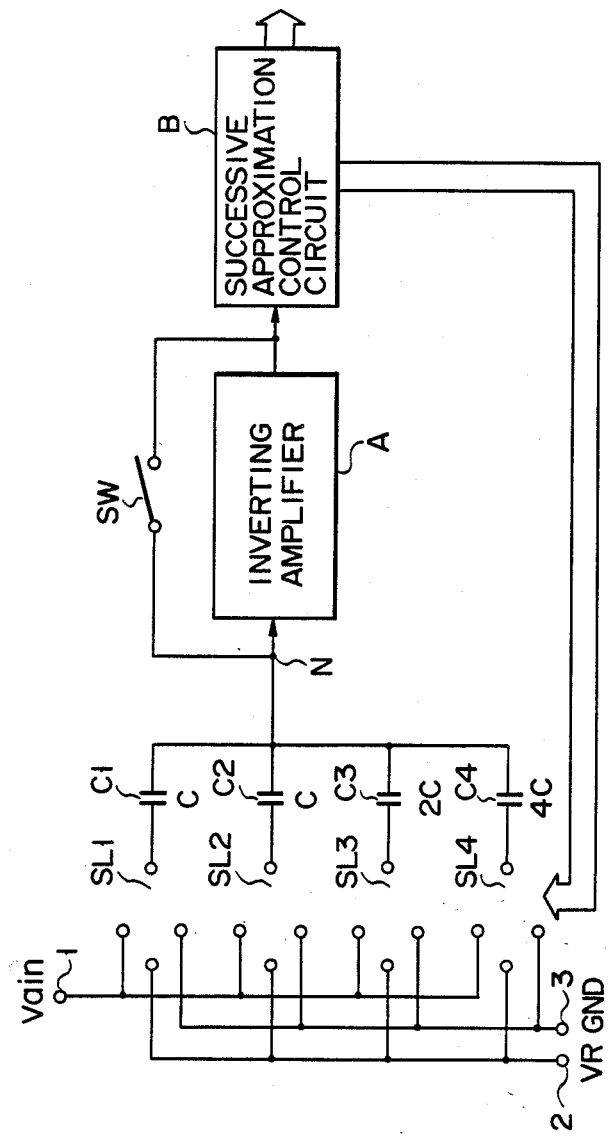
FIG. 1 is a circuit diagram of a conventional successive approximation type A/D converter.

In this case, the A/D-converting operation of the above-described successive approximation type A/D converter is substantially the same as that of the conventional successive approximation type A/D converter described with reference to FIG. 1. However, they differ in the following points.

According to the embodiment, in the sample mode, capacitance $Q8=(Vop-Vain)\cdot 8C$ is stored in capacitors C2 to C4 of the capacitor array, and capacitance $Q_{F8}=Vop\cdot C_F$ is stored in capacitor $C_F$. Thus, for example, when selector SL4 is set in a state for selecting the reference voltage before selectors SL1 to SL3 are set in a state for selecting the ground voltage terminal, because of the influences of a switching operation in the capacitor array when the sample mode is switched to the approximation mode, potential V1 at node N becomes:

$$V1=\{1/(4C+C_F)\}\{(Vop+V_R-Vain)\cdot 4C = VOP\cdot C_F\} \quad (6)$$

Figure 2A:
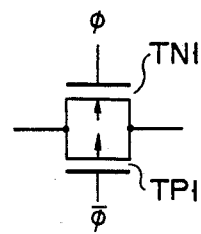
FIG. 2A is a circuit diagram showing a detailed arrangement of a switch SW in FIG. 1.
Figure 2B:
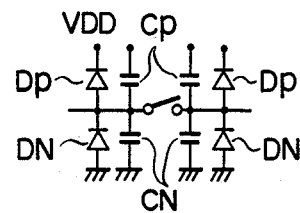
FIG. 2B is an equivalent circuit of FIG. 2A.

In this case, when power source voltage $V_{DD}$, reference voltage $V_R$, and threshold voltage Vop of the above described A/D converter are respectively set at 5 V, 5 V, and 2.5 V, potential V1 becomes 5 V because $C_F=4C$. Therefore, even when the CMOS analog switch shown in FIGS. 2A and 2B is used as switch SW, the charges stored in capacitors C1 to C4 will not leak therefrom because diodes $D_p$ are not turned on. In addition, the input impedance of inverting amplifier A is set to be very high using, e.g., the gate input of a MOS transistor as the input stage, thereby preventing the charges stored in capacitors C1 to C4 from leaking.

As is apparent from equation (6), potential V1 at node N decreases with an increase in analog input voltage Vain as compared with potential 0 V when the sample mode is switched to the approximation mode. Therefore, the charge leakage due to diodes $D_p$ can further and more reliably be prevented.

In contrast to the above case, for example, when selectors SL1 to SL3 are set in a state for selecting the ground terminal before selector SL4 is set in a state for selecting the reference voltage terminal, because of the influences of a switching operation in the capacitor array when the sample mode, is switched to the approximation mode, even if Vain=5 V, diodes $D_N$ of the CMOS analog switch shown in FIGS. 2A and 2B are not turned on because potential V1 becomes 0 V at $V_R=0$ V according to equation (6). It is for this reason that the charges at node N do not leak. Furthermore, in this case, as Vain becomes lower than 5 V, potential V1 at node N becomes higher than 0 V, as is apparent from equation (6). Therefore, the charge leakage due to diodes $D_N$ can be further reliably prevented.

As has been described above, according to the A/D converter of the present invention, since the presence of capacitor $C_F$ prevents the potential at the input terminal node of the voltage comparing inverting amplifier from being greatly changed to become higher than power source voltage $V_{DD}$ or lower than the ground voltage due to the influence of a switching operation of the capacitor array for generating a local analog signal, leakage of charges at the node can be prevented. Therefore, even if the amplitude of an analog input voltage is equal to the power source voltage amplitude, high-precision A/D conversion can be properly performed.

Figure 4:
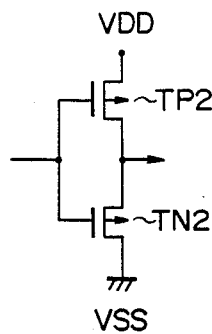
FIG. 4 is a circuit diagram showing a detailed arrangement of the input terminal of inverting amplifier in FIG. 3.
Figure 5:
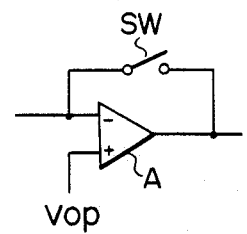
FIG. 5 is a circuit diagram showing a modification of the inverting amplifier in FIG. 3.

Referring to FIG. 4, it is noted that a high impedance can be obtained by using, e.g., a CMOS inverter comprising p- and n-channel transistors TP2 and TN2 as the input stage of inverting amplifier A in the above-described embodiment. In addition, the voltage comparator is not limited to the combination of inverting amplifier A and switch SW as described above. Any circuit can be used as the voltage comparator as long as it can compare an input terminal voltage in the sample mode with that in the approximation mode. Accordingly, inverting amplifier A is not limited to the 1-input type as described in the above embodiment, but a 2-input type (differential type) amplifier as shown in FIG. 5 may be used.

Figure 6:
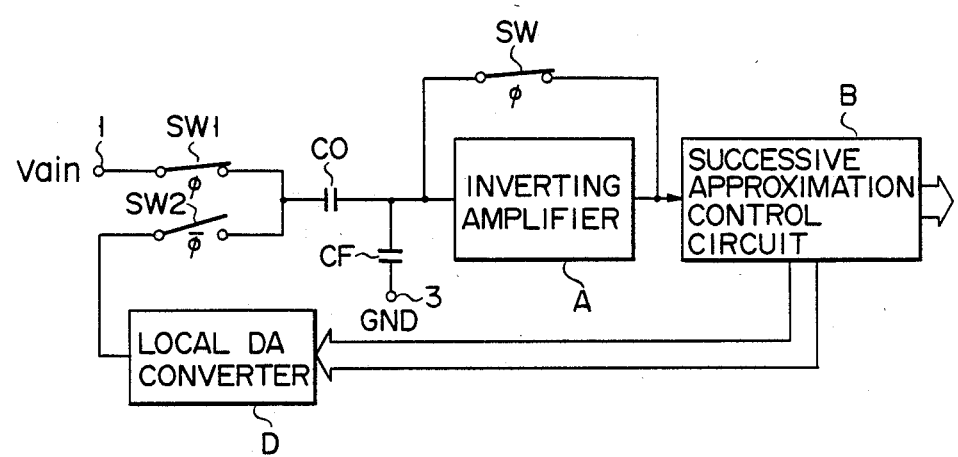
FIG. 6 is a circuit diagram of a successive approximation type A/D converter according to another embodiment of the present invention.

Although in the above embodiment, a capacitor array charge redistribution type is used as the local D/A converter, the present invention is not limited to this. For example, as shown in a successive approximation type A/D converter in FIG. 6, local D/A converter D of, e.g., a resistor segment type may be used, switch SW1, which is turned on in the sample mode ($\phi=$"1"), may be connected between analog input terminal 1 and one terminal of capacitor C0, and switch SW2, which is turned on in the approximation mode ($\bar{\phi}=$"1"), may be connected between the analog output terminal of local D/A converter D and one terminal of capacitor C0. In this case, voltage comparing inverting amplifier A and switch SW are connected to the other terminal of capacitor C0, successive approximation type control circuit B is connected to the output side of inverting amplifier A, and successive approximation control signals from successive approximation type control circuit B are supplied to local D/A converter D. In the abovedescribed A/D converter, by setting the capacitance value of additional capacitor $C_F$ to be substantially equal to that of capacitor C0, a great change in potential at node N when the sample mode is switched to the approximation mode can be prevented.

What is claimed is:

1. A successive approximation type A/D converter comprising:
    a circuit, connected to one terminal of a first capacitor, for sampling an analog signal input in a sample mode and supplying the sampled analog signal input to said one terminal of said first capacitor;
    a voltage comparator, connected to the other terminal of said first capacitor, for comparing an input terminal voltage in the sample mode with an input terminal voltage in an approximation mode;
    a local D/A converter for generating a local analog signal in the approximation mode in accordance with a successive approximation control digital signal and supplying the local analog signal to said voltage comparator through said first capacitor;
    a successive approximation type control circuit for successively outputting the successive approximation control digital signal in the approximation mode while determining values of bits of an A/D conversion output on the basis of a logic level of an output from said voltage comparator; and
    a second capacitor connected between an input terminal of said voltage comparator and a fixed potential terminal having a predetermined voltage, said second capacitor preventing leakage of charge at the input terminal of said voltage comparator to a degree that the input terminal is held at a voltage between and not approximating either of a supplied voltage and said predetermined voltage.

2. A converter according to claim 1, wherein said voltage comparator comprises an inverting amplifier, and a switch connected between input and output terminals of said inverting amplifier.

3. A converter according to claim 2, wherein said switch is a CMOS analog switch.

4. A converter according to claim 2, wherein a MOS transistor having a high input impedance is used as an input stage of said inverting amplifier.

5. A converter according to claim 1, wherein said local D/A converter and said first capacitor constitute a capacitor array charge redistribution type D/A converter having functions of said local D/A converter and said first capacitor.

6. A converter according to claim 1, wherein said local D/A converter is of a resistor segment type.

* * * * *